(12) United States Patent
Grouse et al.

(10) Patent No.: US 6,410,995 B1
(45) Date of Patent: Jun. 25, 2002

(54) TRAY ADAPTED BACK UP POWER SUPPLY FOR AVIONICS EQUIPMENT

(75) Inventors: Charles J. Grouse; Mart D. Dismukes; Gregory W. Purdom, all of Sarasota, FL (US)

(73) Assignee: L3 Communications Corporation, New York, NY (US)

( * ) Notice: Subject to any disclaimer, the term of this patent is extended or adjusted under 35 U.S.C. 154(b) by 0 days.

(21) Appl. No.: 09/578,892

(22) Filed: May 26, 2000

(51) Int. Cl.$^7$ ................................................ H02J 09/06
(52) U.S. Cl. ............................................ 307/64; 307/85
(58) Field of Search ......................... 307/64–66, 85–87

(56) References Cited

U.S. PATENT DOCUMENTS 5,798,458 A * 8/1998 Monroe ........................ 73/587
6,009,356 A * 12/1999 Monroe ........................ 701/14

OTHER PUBLICATIONS

Listing of Papers and Posters for the Internal Symposium on Transportation Recorders May 3–5, 1999.*
www.ihsaviation.com article Aviation News May 1999 entitled FAA To Propose Requirements For 737 Flight Data Recorders, May 3, 1999.*
www.airlinesafety.com article Letters to the Editor Subject: Flight Data Recorders Need Battery Back–Ups, Nov. 1998.*
www.airlinepilots article entitled "Somebody's Watching You. . . NTSB Wants Video in the Cockpit", Apr. 11, 2000.*
www.maxwell.com article entitled "Maxwell Technologies To Demonstrate Ultracapacitors Application As Independent Power Source for "Black BoxΔ Flight Data Recorders", Apr. 23, 1999.*
TSB Issues Aviation Safety Recommendations For Flight Recorder Duration and Power Supply, Transportation Safety Board of Canada, Mar. 09, 1999.*
Feasibility of Battery Backup for Flight Recorders presented by Duncan W. Schofield at the International Symposium on Transportation Recorders, May 3–5 1999.*
Aviation Recorder Overview presented by Dennis R. Grossi at the International Symposium on Transportation Recorders, May 305 1999.*
Testimony of Jim Hall, Chairman National Transportation Safety Board before the Subcommittee on Transportation and Related Agencies Committee on Appropriations House of Representatives Regarding Aviation Safety, Mar. 10, 1999.*

* cited by examiner

Primary Examiner—Fritz Fleming
(74) Attorney, Agent, or Firm—Joseph J. Kaliko

(57) ABSTRACT

The invention provides a back up power supply for avionics equipment that can be installed in existing avionics equipment trays without having to rewire the aircraft. According to a preferred embodiment of the invention (described for illustrative purposes in the context of providing a power supply back up for a cockpit voice recorder (CVR)), the power supply/CVR combination is retrofit in an existing CVR rack. The power supply is modular; removable/replaceable; and is "independent" relative to the main aircraft power source and wiring. The modular power supply is designed to fit into a conventional CVR tray; and the modular power supply is designed to accept an existing CVR. According to a preferred embodiment, the power supply is "plug compatible" with the existing electrical connector in the CVR tray and includes circuitry which allows both the power supply and CVR to be tested using the existing CVR test button in the cockpit; and to report faults from either unit using existing aircraft wiring. The power supply includes circuitry which automatically electrically disconnects it from the CVR and exposed pins when the power supply is removed from the CVR tray.

40 Claims, 6 Drawing Sheets

FIG. 17

TRAY ADAPTED BACK UP POWER SUPPLY FOR AVIONICS EQUIPMENT

BACKGROUND OF THE INVENTION

1. Field of the invention

The invention relates generally to avionics equipment, such as flight recorders. More particularly, the invention relates to a back up power supply for avionics equipment that can be installed in existing equipment trays located for example, but not exclusively, in the tail section of an aircraft, without having to rewire the aircraft.

2. State of the Art

The state-of-the-art is best introduced with the excerpts and paraphrases from the National Transportation Safety Board, Safety Recommendation A-99-16-18, dated Mar. 9, 1999.

Although the recommendations set forth hereinafter are directed to back up power supplies for cockpit voice recorders (CVR's) per se; those skilled in the art will readily appreciate that back up power supplies may be useful to power other types of avionics equipment should power from the aircraft's power supply be lost. Hence reference hereinafter to CVR's is intended for illustrative purposes only; and not to limit the scope of the invention described and claimed herein.

Many recent aircraft accidents have illustrated the need for an "independent" back-up power supply for the aircraft CVR. As used herein, the word "independent" means independent from the aircraft power supply, not necessarily independent from the CVR unit.

For example, on May 11, 1996, the crew of ValuJet flight 592, a DC-9-32, reported smoke and fire shortly after departing Miami, Fla. The flight recorders stopped about 40 to 50 seconds before the airplane crashed on its return to the airport.

On Jul. 7, 1996, TWA flight 800, a Boeing 747-100, on an international passenger flight from New York to Paris, exploded about 13 minutes after takeoff as it was climbing through 13,700 feet. Both flight recorders stopped at the time of the explosion, but the airplane did not hit the water off Long Island, N.Y., for another 40 to 50 seconds.

On Dec. 19, 1997, SilkAir flight 185, a Boeing 737, entered a rapid descent from 35,000 feet, which ended with a high speed impact in the Sumatran River near Palembang, Indonesia. The Indonesian investigation determined that both flight recorders stopped prior to the airplane entering the rapid descent.

On Sep. 2, 1998, Swissair flight 111, an MD11, on a regularly scheduled passenger flight from New York to Geneva, Switzerland, diverted to Halifax after the crew reported smoke in the cockpit; the airplane crashed into the waters near Peggy's Cove, Nova Scotia. Thus far, the Canadian Transportation Safety Board's (TSB) investigation has been severely hampered by the lack of data from the cockpit voice recorder (CVR), which stopped nearly 6 minutes before the airplane hit the water.

These recent accidents are just the latest in a long history of accident and incident investigations that were hindered by the loss of flight recorder data due to the interruption of aircraft electrical power.

Since 1983, the origin date of the NTSB database, there have been 52 accidents and incidents, including the 4 recent accidents mentioned above, in which information from either a CVR or FDR (flight data recorder) or both were lost due to interruption of electrical power following an engine or generator failure or crew action. Until recently, recorder technology did not offer a practical solution to the problem of loss of electrical power to the on-board recorders. However, recent innovations in recorder and power supply technologies have made it possible to provide an independent power source that would provide sufficient power to operate a solid-state flight recorder for a predetermined period of time, for example, 10 minutes.

In assessing the feasibility of an independent power source, strong consideration must be given to reliability, complexity, maintainability, and cost. The independent power source must also automatically engage when power to the recorders is lost; and disengage after a predetermined period of time so as not to overwrite recorded data.

Older model tape-based recorders require too much electrical power and are not easily adapted to a direct current (d.c.) battery or capacitor. However, the relatively low power requirements of solid-state flight recorders (about 10 to 12 watts from a 28-volt d.c. system) would permit the use of an independent power source. Thus, it is evident that the use of an independent power source would also require the use of solid-state flight recorders.

Current regulations call for a CVR with a minimum 30-minute recording duration. This minimum requirement was based on the limitations of 1960s recorder technology, which was constrained by the amount of magnetic tape that could be impact/fire protected.

In the years since CVRs became mandatory, the Safety Board has investigated many accidents and incidents for which the 30-minute CVR recording was not sufficient to retain key events. This prompted the Safety Board to recommend in 1996 that all newly manufactured CVRs be SSCVRs (solid state CVRs) with a 2-hour recording duration (Safety Recommendation A-96-171). Accident investigations in which the Safety Board has participated subsequent to the issuance of Safety Recommendation A-96-171 continue to demonstrate that a lack of recorded voice and other aural information can inhibit safety investigators and delay or prevent the identification of safety deficiencies.

The CVR installed on Swissair flight 111 used a continuous-loop magnetic tape with a 30-minute duration. The earliest information on the CVR tape was recorded about 15 minutes before the crew noted an unusual odor. Crew conversations and cockpit sounds prior to the beginning of this 30-minute recording might have provided insight into any initiating or precursory events that led to the accident.

About 38 minutes prior to the crew noting an unusual odor, Boston Center issued flight 111 a radio frequency change. During the following 13 minutes, Boston Center made repeated attempts to contact flight 111 but did not establish contact. Any cockpit conversations, flight deck noises, or attempted crew transmissions that occurred during this period were subsequently overwritten on the CVR, and thus were not available to the accident investigators.

Although 30-minute magnetic tape CVRs are no longer being manufactured, units still exist and could be installed on aircraft today. Given the continued need for longer periods of recorded sound to capture the initiating events of aviation accidents, and the availability of and trend toward 2-hour CVRs, the Safety Board has stated that a retrofit program is warranted.

The Safety Board has further stated that the Federal Aviation Administration (FAA) should require the retrofit after Jan. 1, 2005, of all CVRs on all airplanes required to carry both a CVR and a FDR with a CVR that meets TSO C123a and is capable of recording the last 2 hours of audio.

A number of options have been identified for realizing an independent power source. In assessing the feasibility of these options, batteries and capacitors appear to be the most effective means of providing aircraft independent power. These and other power sources may be selected by those skilled in the art based on various well known design criteria and objectives. For example, the capacitor method would provide a power source that requires very little maintenance when compared with a rechargeable battery since, unlike a rechargeable battery, the capacitor method would not require any power sensing circuitry for normal operation. Nevertheless, total package weight, center of gravity, packaging constraints (dimensional), etc., will all factor in when selecting among the possible candidates for an independent power supply.

To maximize recorder reliability and to minimize any crew intervention, the independent power source should automatically engage whenever the normal electrical power to the recorder ceases, even when the aircraft is powered down normally. To increase the probability of recording accident data, the independent power source should be capable of powering the recorder for 10 minutes after main power to the recorder shuts off; and again, be capable of automatic shut down after a predetermined period of time to avoid overwriting data.

In the case of a CVR, the area microphone is powered by the CVR; as long as the CVR receives power, the area microphone will continue to operate and the CVR will continue to record sounds from the area microphone, provided that the connection between the microphone and the recorder is not compromised.

In the case of the SilkAir accident, the 2-hour SSCVR stopped recording 5 minutes 58 seconds prior to the DFDR (digital flight data recorder) stopping, which stopped 1 minute 54 seconds prior to impact. Thus, any valuable dialog in the cockpit regarding the airplane status for those 7 minutes 52 seconds was lost. However, providing a 30-minute CVR with 10 minutes of independent power after main power ceases would result in about one-third of the in-flight audio being recorded over. Thus, it would not be acceptable to fit 30-minute CVRs with an independent power supply that automatically engages when aircraft electrical power is terminated for any reason.

With maintenance-free independent power sources, it is now feasible to provide an independent power source for new-technology CVRs for a specific period of time, in the event that aircraft power sources to the CVR are interrupted or lost.

Accordingly, the Safety Board recommended that for the CVR retrofit after Jan. 1, 2005, the FAA should also require the CVR to be provided with an independent power source that is located with the CVR and that automatically engages and provides 10 minutes of operation whenever aircraft power to the recorder ceases, either by normal shutdown or by a loss of power to the bus.

The Canadian Transportation Safety Board (TSB) shares the view that a CVR retrofit is warranted and has developed a similar recommendation, which was issued to the Canadian and European regulators in early March 1999. The Safety Board and the TSB have urged that the actions recommended by the two investigative authorities be adopted by civil aviation regulators worldwide.

Accordingly, the National Transportation Safety Board has recommended that the Federal Aviation Administration: Require retrofit after Jan. 1, 2005, of all cockpit voice recorders (CVRS) on all airplanes required to carry both a CVR and a flight data recorder (FDR) with a CVR that (a) meets Technical Standard Order (TSO) C123a, (b) is capable of recording the last 2 hours of audio, and (c) is fitted with an independent power source that is located with the digital CVR and that automatically engages and provides 10 minutes of operation whenever aircraft power to the recorder ceases, either by normal shutdown or by a loss of power to the bus.

Although the aforementioned recommendations are directed to CVR's specifically, back up power supplies which can be installed in existing equipment storage racks, do not require rewiring the aircraft, are easy to maintain and test, etc., would be useful for providing a back up power source for other types of avionics equipment including, for example, FDR's, etc.

Accordingly, although the invention will be described hereinafter with reference to an illustrative embodiment thereof (a modular back up power supply for a CVR), the scope of the invention is not intended to be limited thereby, i.e., the invention covers back up power supplies for avionics equipment in general; modular or not.

Furthermore, although the recommendations of the NTSB are quite specific; and although the DOT and ARINC have issued detailed specifications for the new CVRs, many questions still remain as to how to provide the recommended back up power supply, how the back up power supplies will be installed in the confines of an aircraft where space and other constraints limit where and how to locate and install such units; etc.

For example, will it be necessary to rewire at least some portion of the aircraft to install a back up power supply? Will it be further necessary to rewire the aircraft so that the CVR and it's back up power supply may be tested from the cockpit? Will it be necessary to require and/or reconfigure the equipment storage racks in order to accommodate the back up power supply and a CVR?

It should be noted that industry has recommended that any separate power supply be located outside the existing equipment racks. This recommendation is problematic in that additional space in the aircraft is required; safety and aircraft rewiring become issues if external wiring is required to couple rack mounted equipment to a back up power supply unit located outside a rack; where to locate mounts for the power supplies becomes an issue; the weight of the added independent power supply units needs to be considered, etc.

Accordingly, and notably in addition to the aforementioned recommendations, it would be desirable to be able to provide a back up power supply unit for avionics equipment which, together with the avionics equipment, can use existing racks.

It would be further desirable to be able to provide a back up power supply that does not require an independent mechanical mount in the confines of the aircraft.

Further still, it would be desirable to provide a back up power supply that does not require any aircraft rewiring.

It would also be desirable to provide a back up power supply/avionics equipment combination that has a combined weight that is less than or equal to the weight of a piece of conventional (not backed up) avionics equipment alone.

Still further, it would be desirable to provide a modular back up power supply for use with avionics equipment to allow for easy installation and testing of the back up unit independent (where the modular design is used) of the avionics equipment being powered. This would avoid having to re-test an integrated back up power supply/avionics equipment combination to meet all the specs of the avionics equipment (if opened), as would be the case where an integrated unit (which also comes within the scope of the invention) is used.

Further yet, it would be desirable to provide a module fault reporting capability for both a back up power supply module and avionics equipment module, using the existing wiring for reporting equipment module faults; and to provide a "push to test" feature for testing either (or both) of the back up power supply module and equipment backed up, using the existing cockpit button and electrical connection to a rack presently used to test the equipment (not backed up) alone.

SUMMARY OF THE INVENTION

It is therefore a primary object of the invention to provide a back up power supply for avionics equipment in general.

It is a more specific object of the invention to provide a tray adapted back up power supply for avionics equipment in general, i.e. a back up power supply unit for avionics equipment which, together with the avionics equipment, can use existing racks.

It is a further object of the invention to provide a back up power supply for avionics equipment that does not require additional wires or cables to couple the power supply to the equipment.

Furthermore, it is an object of the invention to provide a back up power supply that does not require any aircraft rewiring.

Further still, it is an object of the invention to be able to provide a back up power supply that does not require an independent mechanical mount in the confines of the aircraft.

It is also an object of the invention to provide a back up power supply/avionics equipment combination that has a combined weight that is less than or equal to the weight of a piece of conventional (not backed up) avionics equipment alone.

Still further, it is an object of the invention to provide a modular back up power supply for use with avionics equipment to allow for easy installation and testing of the back up unit independent (where the modular design is used) of the avionics equipment being powered.

Further yet, it is an object of the invention to provide a module fault reporting capability for both a back up power supply module and avionics equipment module, using the existing wiring for reporting equipment module faults; and to provide a "push to test" feature for testing either (or both) of the back up power supply module and equipment backed up, using the existing cockpit button and electrical connection to a rack presently used to test the equipment (not backed up) alone.

It is also an object of the invention to provide a cockpit voice recorder (CVR) with an independent power supply.

Still another object of the invention is to provide a CVR having an independent power supply which meets the requirements and recommendations of the NTSB, DOT, and ARINC.

It is another object of the invention to provide a CVR having an independent power supply which does not require any rewiring of an aircraft in order that the backed up avionics equipment (e.g., a CVR) and independent power supply be tested from the cockpit.

It is also an object of the invention to provide an independent power supply which does not occupy an undue amount of space.

It is still another object of the invention to provide a CVR and independent power supply which is retro-fittable into the existing equipment rack which now receives a prior art CVR.

It is also an object of the invention to provide an independent power supply which does not require an independent mechanical mount in the confines of the aircraft.

It is still another object of the invention to provide a CVR and independent power supply which has a similar weight and center of gravity as the existing CVRs.

It is also an object of the invention to provide a modular back up power supply which is easy to install and test.

It is still another object of the invention to provide a CVR and independent power supply which utilize the existing "push to test" circuits in the cockpit.

Further still, it is an object of the invention to provide methods for providing back up power for avionics equipment in accord with the aforestated objects.

In accord with these and other objects of the invention, which will be discussed in detail below, the backup power supply for avionics equipment will be described with reference to an illustrative embodiment, namely a cockpit voice recorder and independent power supply.

The cockpit voice recorder and independent power supply of a preferred embodiment of the present invention includes separate, modular CVR and power supply units. The power supply is designed to fit into a conventional CVR tray and the new CVR is designed to fit into the power supply. The combination is designed to fit within approximately the footprint and space occupied by a "conventional" CVR as defined hereinafter (including specific dimensions being set forth), with reference to the description of the illustrative prior art tray and CVR shown in FIGS. 1–6.

According to the preferred embodiment of the invention, the power supply is "plug compatible" with the existing electrical connector in the existing CVR tray and includes circuitry which allows both the power supply and the CVR to be tested using the existing CVR test button in the cockpit. Moreover, for safety purposes, the power supply includes circuitry which automatically electrically disconnects it from the CVR and exposed pins when the power supply is removed from the existing CVR tray.

Furthermore, according to a preferred embodiment of the invention, the power supply utilizes the same "push to test" circuitry as the existing CVRs; and the same wiring used to output fault indications from the recorder alone are used to output fault indications from both the power supply and recorder (whether modular units or integrated as one device).

The invention also contemplates methods for providing a back up power supply for avionics equipment, comprising the steps of: (a) utilizing a back up power supply that includes a self contained power source; (b) combining said back up power supply with the avionics equipment such that the combination of equipment fits into a conventional equipment tray; and (c) retrofitting the combination of said power supply and said avionics equipment into a conventional equipment tray without rewiring the aircraft.

Further methods contemplated by the invention include the steps of: (a) fabricating a back up power supply module, including a self contained power source, that is plug compatible with a conventional tray avionics equipment connector; and (b) fabricating said power supply module to be plug compatible with said avionics equipment, the combination of said power supply and said avionics equipment being able to fit substantially within said tray.

The CVR and power supply of the present invention are preferably (though not necessarily) modular, easy to install, require no cables, occupy approximately the same space previously occupied by the existing CVR, and have substantially the same center of gravity as the existing CVR.

Again, although the presently preferred embodiment includes separate CVR and power supply modules, the invention contemplates and encompasses a single integrated unit which fits into an existing equipment rack.

Further advantages and features of the invention include providing a back up power supply unit for avionics equipment which, together with the avionics equipment, can use existing racks; a back up power supply that does not require an independent mechanical mount in the confines of the aircraft; a back up power supply that does not require any aircraft rewiring; a back up power supply/avionics equipment combination that has a combined weight that is less than or equal to the weight of a piece of conventional (not backed up) avionics equipment alone; a modular back up power supply for use with avionics equipment to allow for easy installation and testing of the back up unit independent (where the modular design is used) of the avionics equipment being powered; a module fault reporting capability for both a back up power supply module and avionics equipment module, using the existing wiring for reporting equipment module faults; and to provide a "push to test" feature for testing either (or both) of the back up power supply module and equipment backed up, using the existing cockpit button and electrical connection to a rack presently used to test the equipment (not backed up) alone.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
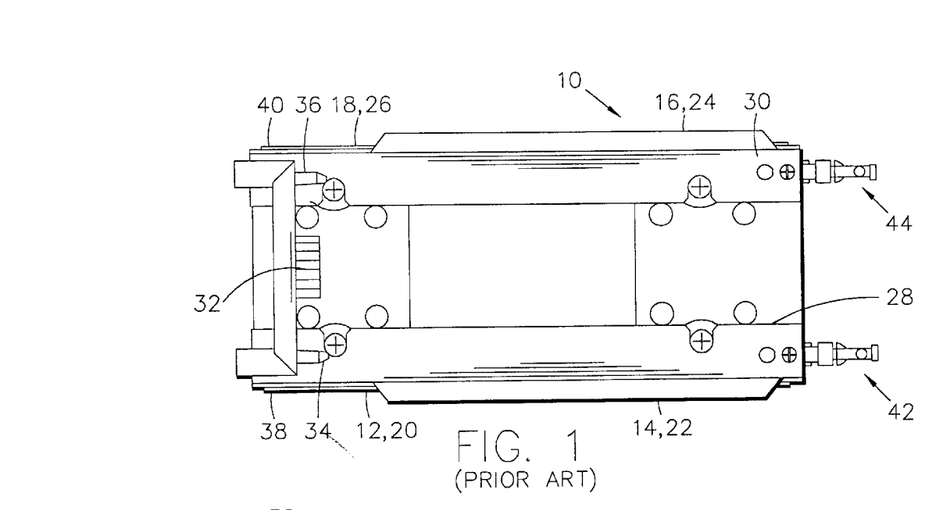
FIG. 1 is a top view of a prior art CVR tray.
Figure 2:
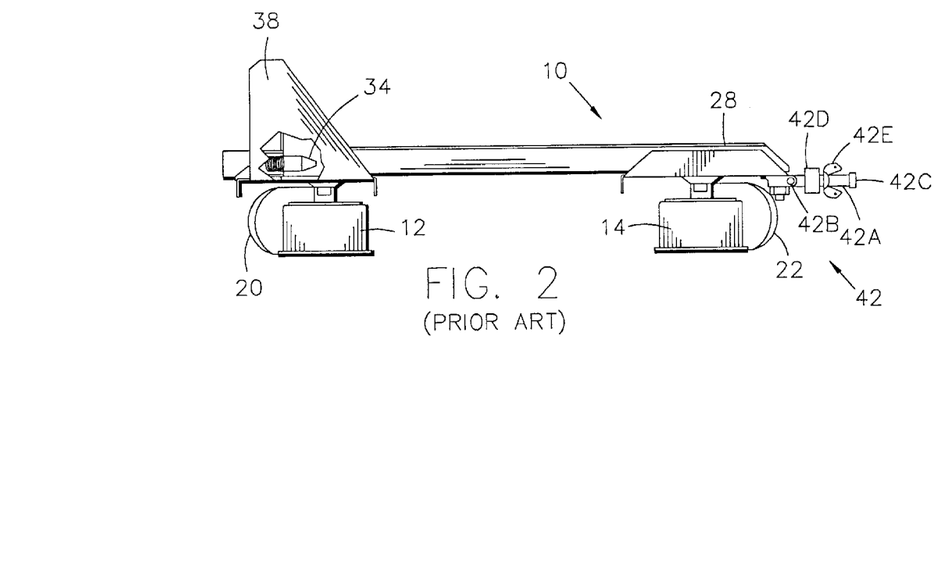
FIG. 2 is a side elevation view of the prior art CVR tray of FIG. 1.
Figure 3:
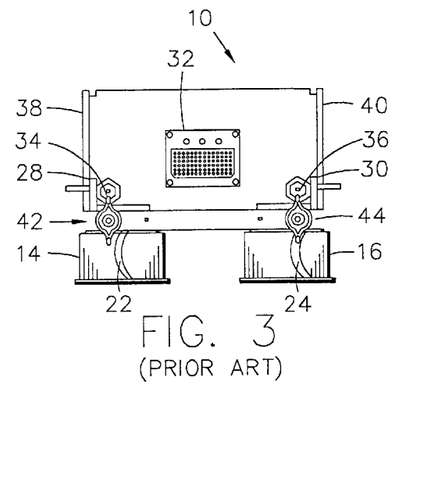
FIG. 3 is a front end view of the prior art CVR tray of FIGS. 1 and 2.

Referring now to FIGS. 1 through 3, a prior art CVR tray 10 is shown. The tray 10 is supported by four non-conductive vibration isolators 12, 14, 16, 18 and is electrically grounded by a corresponding four grounding straps 20, 22, 24, 26.

As seen best in FIG. 3, the tray 10 has a pair of spaced apart parallel rails 28, 30 upon which a CVR is to be received and slid toward the back of the tray 10 where a male electrical connector 32 electrically couples with a female electrical connector in the CVR.

In order to assure proper alignment between the connectors, a pair of tapered alignment rods 34, 36 as well as a pair of upstanding side supports 38, 40 are provided adjacent to the end of the rails 28, 30. A pair of locking nuts 42, 44 are provided at the end of the rails 28, 30 opposite the electrical connector 32. These will secure the CVR in place as shown in prior art FIGS. 4–6.

Each of the locking nuts, e.g. 42, has a threaded member 42a, coupled to the tray by a pivot pin 42b and having an end stop 42c. On the threaded member 42a are a sliding collar 42d with an undercut (not shown) and a wing nut 42e.

The standard ("conventional") avionics rack shown in FIGS. 1–3 has a width of 5.38 inches, a length of 12.41 inches and a height of 7.62 inches.

Figure 4:
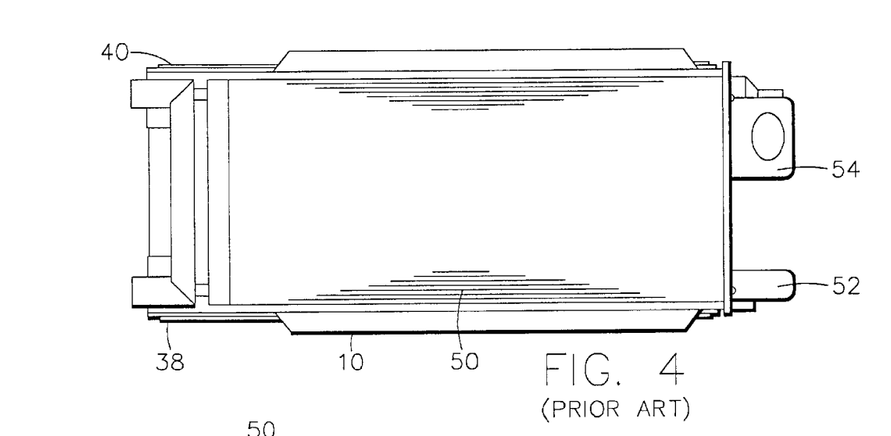
FIG. 4 is a top view of a prior art CVR tray with a prior art CVR installed therein.
Figure 5:
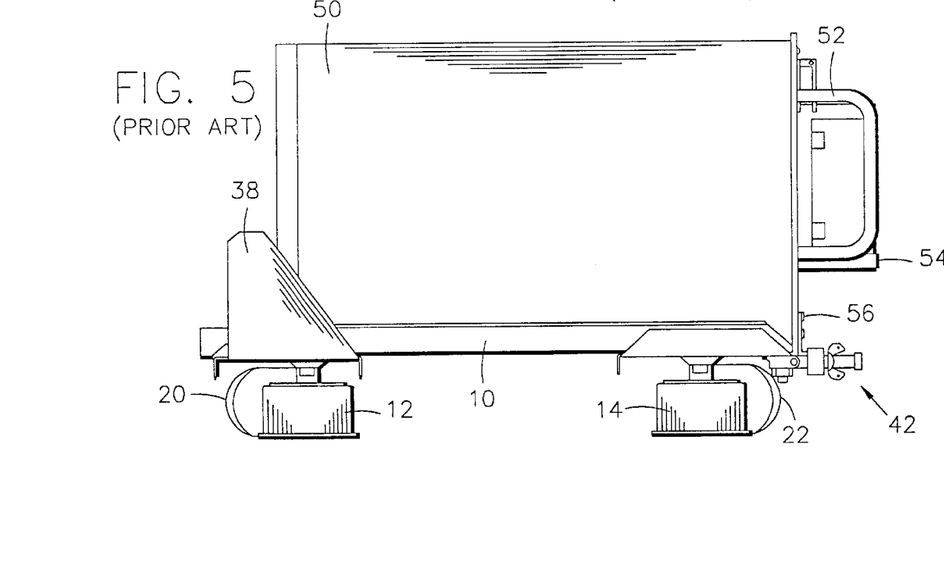
FIG. 5 is a side elevation view of the prior art CVR tray and CVR of FIG. 4.
Figure 6:
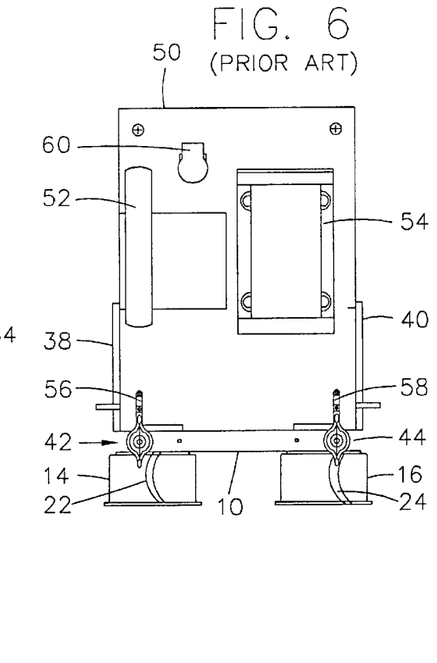
FIG. 6 is a front end view of the prior art CVR tray and CVR of FIGS. 4 and 5.
Figure 7:
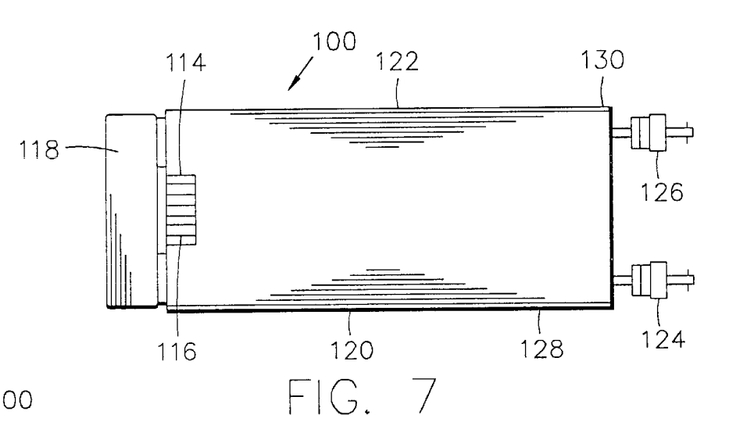
FIG. 7 is a top view of an independent power supply according to a preferred embodiment of the invention.
Figure 8:
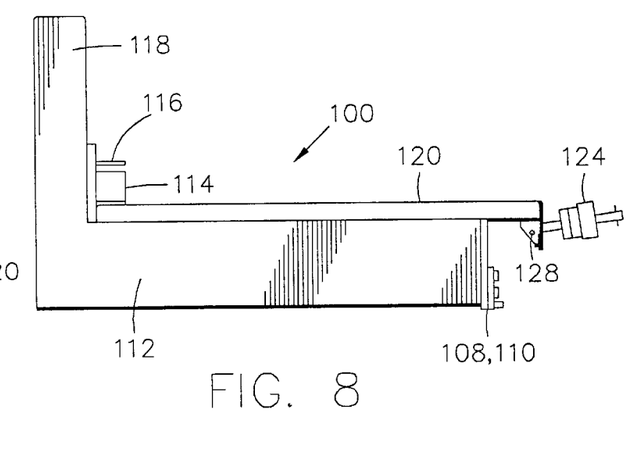
FIG. 8 is a side elevation view of the independent power supply of power supply depicted in FIG. 7.

Turning now to FIGS. 4–6, a prior art CVR 50 is shown installed in the tray 10. The standard ("conventional") CVR shown in FIGS. 4–6 is 4.88 inches wide and fits within tray 10.

The CVR 50 has a gripping handle 52, a bracket 54 for a pinger (not shown), a pair of L-shaped brackets 56, 58, and a covered headset connector 60. The CVR 50 is installed by sliding it on the rails (28, 30 in FIGS. 1–3) until two holes in the rear (not shown) of the CVR engage the tapered alignment rods (34, 36 in FIGS. 1–3) and the female electrical connector (not shown) in the rear of the CVR couples with the male electrical connector (32 in FIGS. 1 and 3).

The remaining components depicted in FIGS. 4–6, identified by reference numerals 12, 14, 16, 20., 22, 24, 38 and 40, are identical to the corresponding numbered components referred to and described hereinbefore with reference to FIGS. 1–3.

After the CVR is in position, the two locking nuts 42, 44 are used to secure it to the tray. In particular, the wing nuts are rotated until they hit the stops and the collars are pulled back against the wing nuts, the pivoting threaded member is lifted and the collars are slid over the L-shaped brackets 56, 58. The wing nuts are then tightened.

As mentioned above, the independent power supply of the invention is designed to fit into the existing CVR tray shown in prior art FIGS. 1–6.

Turning now to FIGS. 7–10, the independent power supply 100 of the preferred embodiment of the present invention preferably has a footprint which is substantially the same as the existing CVR (50 in FIGS. 4–6). This again is a preferred design for the power supply set forth for illustrative purposes only; but is not required to practice the invention per se.

For example, a power supply with a footprint of one half the size of a conventional CVR may be combined with a reduced size CVR that when combined with the power supply has approximately the footprint of and occupies approximately the same space as a conventional CVR. This and many other variants of the invention designed to fit the CVR and power supply combination within approximately the same space as a conventional CVR (in an existing rack), all come within th scope and spirit of the invention.

Figure 9:
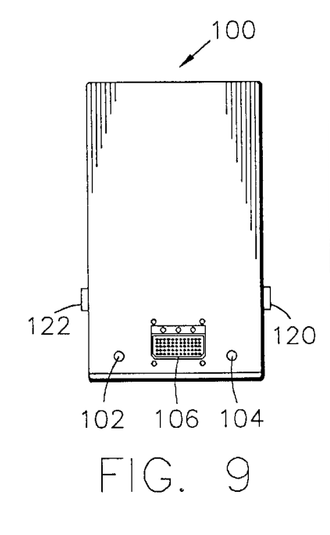
FIG. 9 is a rear end view of the independent power supply power supply depicted in FIG. 7.
Figure 10:
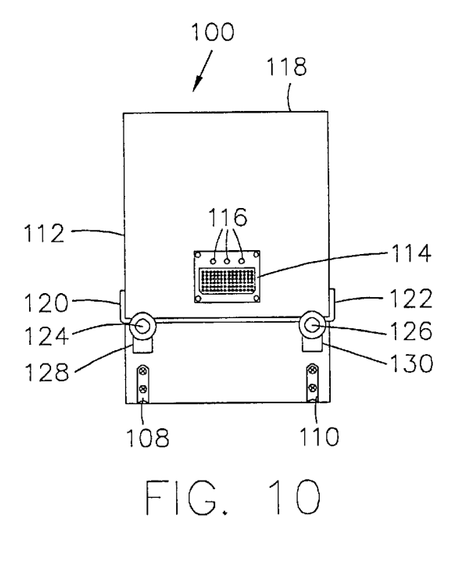
FIG. 10 is a front end view of the independent power supply power supply depicted in FIG. 7.

Reference should now be made to FIG. 9 to best see one example of how the rear end of independent power supply 100 can be designed to couple with an existing connector (like connector 32 of FIG. 3 shown in a prior art tray).

In particular, as best seen in FIG. 9, the rear end of independent power supply 100 has a pair of holes 102, 104 adjacent to a female electrical connector 106, all three of which are configured to interface with an existing tray in the same manner as an existing CVR. Similarly, as seen best in FIGS. 8 and 10, the front end of the independent power supply 100 has two L-shaped brackets 108, 110 which are configured to act in the same manner as the L-shaped brackets of the existing CVR.

The remainder of the independent power supply 100 according to a preferred embodiment of the invention includes a generally L-shaped chassis 112 within which various circuits (described below) are contained including a means for storing a charge, for example, a capacitor or battery (not shown) which is the power source for the independent power supply 100 and means for shutting off the power supply after a predetermined period, e.g., 10 minutes.

A male electrical connector 114 with a plurality of keying guides 116 is mounted on the interior of the upstanding rear wall 118 of the chassis 112. This connector mirrors connector 32 that the CVR would normally "see" being placed into a conventional tray. A pair of parallel guiding rails 120, 122 extend from the rear wall 118 defining a platform for receiving a CVR according to a preferred embodiment of the invention, as will be described hereinafter with reference to FIGS. 11–13. A pair of ratchet nuts 124, 126 are hingedly coupled by pivot pins 128, 130 adjacent to the front ends of the respective guiding rails 120, 122.

Figure 11:
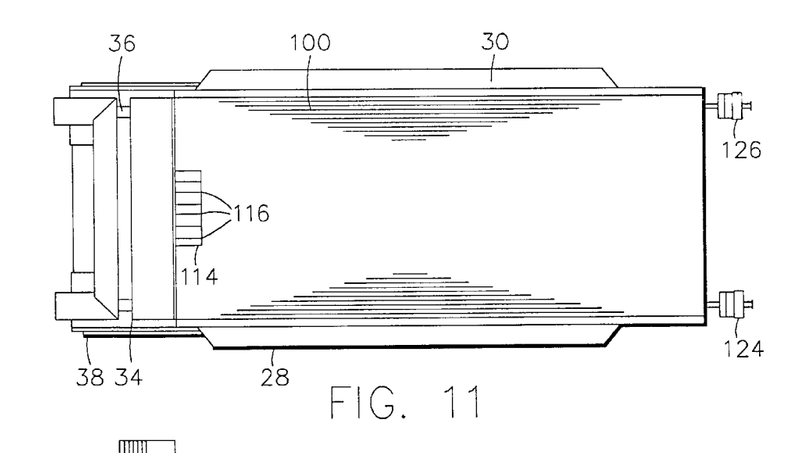
FIG. 11 is a top view of the independent power supply power supply depicted in FIG. 7, installed in an existing CVR tray.
Figure 12:
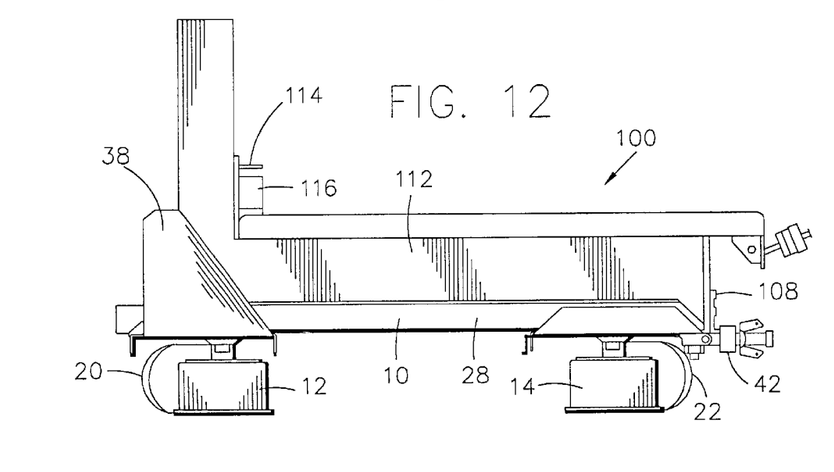
FIG. 12 is a side elevation view of the independent power supply depicted in FIG. 7, installed in an existing CVR tray.
Figure 13:
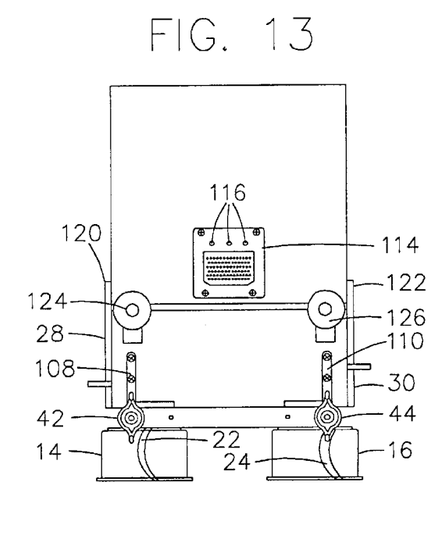
FIG. 13 is a front end view of the independent power supply depicted in FIG. 7, installed in an existing CVR tray.

Turning now to FIGS. 11–13, the independent power supply 100 of the invention fits into the existing CVR tray 10 as described above and as shown in these figures.

More particularly, the chassis 112 lies between the rails 28, 30. The guide holes 102, 104 (FIG. 9) are engaged by the tapered guide rods 34, 36; and the male connector 32 (FIGS. 1 and 3) is coupled to the female connector 106 (FIG. 9). The lock nuts 42, 44 are secured over the L-shaped brackets 108, 110.

The remaining components depicted in FIGS. 11–13, identified by reference numerals 12, 14, 16, 20, 22, 24, 28, 30, 38, 114 and 116, are identical to the corresponding numbered components referred to and described hereinbefore with reference to FIGS. 1–10.

Figure 14:
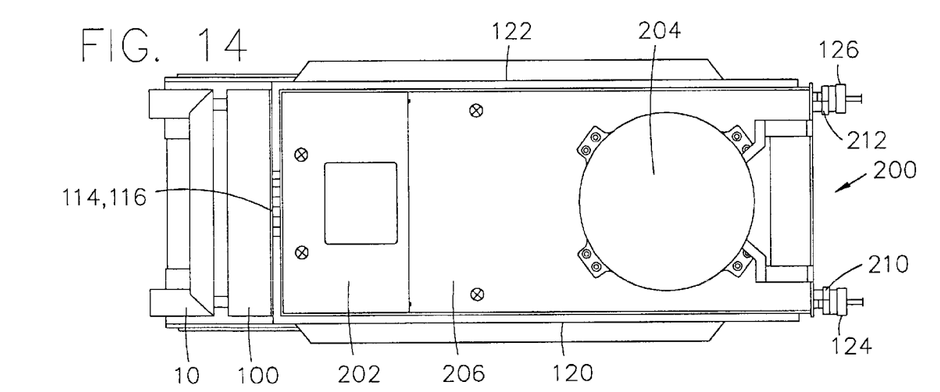
FIG. 14 is a top view of a CVR according to a preferred embodiment of the invention, installed in an independent power supply of a type further contemplated by a preferred embodiment of the invention, with the power supply being installed in an existing CVR tray.
Figure 15:
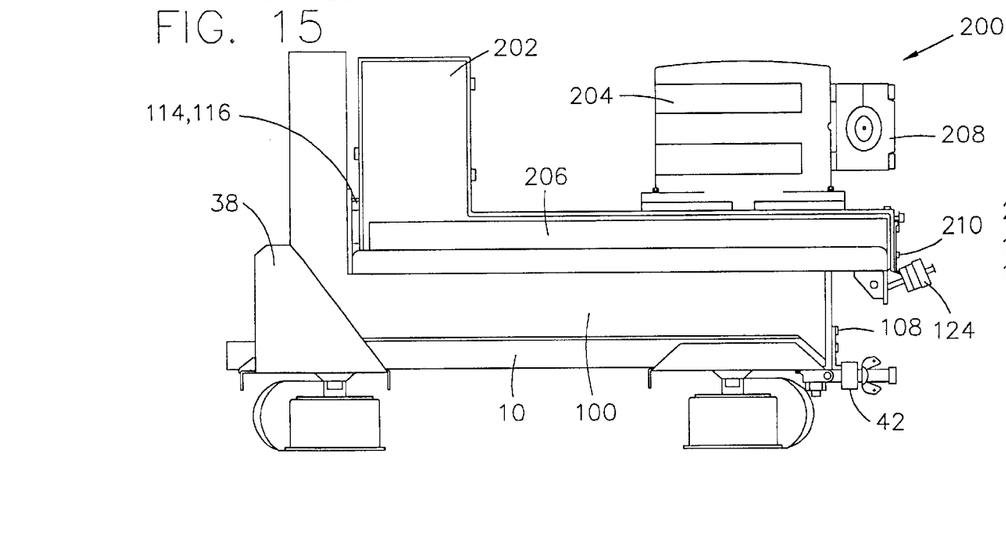
FIG. 15 is a side elevation view of a CVR according to a preferred embodiment of the invention, installed in an independent power supply of a type further contemplated by a preferred embodiment of the invention, with the power supply being installed in an existing CVR tray.
Figure 16:
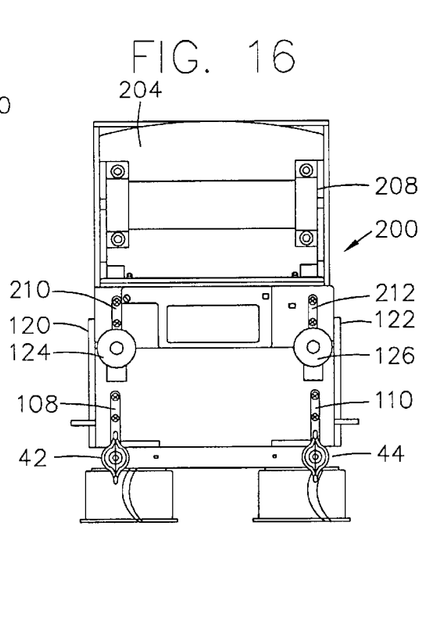
FIG. 16 is a front end view of a CVR according to a preferred embodiment of the invention, installed in an independent power supply of a type further contemplated by a preferred embodiment of the invention, with the power supply being installed in an existing CVR tray.

As mentioned above, the independent power supply 100 of the preferred embodiment of the invention is intended to be used with a cockpit voice recorder (CVR) which is designed to mate with and be mounted in the power supply. FIGS. 14–16 illustrates such a CVR 200 mounted in and electrically coupled to the power supply 100.

The CVR 200 generally includes an L-shaped chassis s 202 housing the electronics of the CVR 200. The chassis 202 fits between the guide rails 120, 122 of the power supply 100.

A female electrical connector (not shown) is provided on the rear wall of the chassis 202 and couples to the connector 114, 116 on the power supply. An impact protected solid state memory 204 is mounted on the bed 206 of the chassis 202; and a pinger bracket 208 is mounted on the housing of the memory 204. A pair of L-shaped brackets 210, 212 are provided on the lower front end of the chassis. These brackets are engaged by the ratchet nuts 124, 126.

The remaining components depicted in FIGS. 14–16, identified by reference numerals 10, 42, 44, 108 and 110, are identical to the corresponding numbered components referred to and described hereinbefore with reference to FIGS. 1–13.

Comparing FIGS. 14–16 with prior art FIGS. 4–6, it will be appreciated that the combined power supply 100 and CVR 200 of the invention occupy approximately the same space as the conventional CVR 50 in an existing CVR tray 10. Moreover, as mentioned above, the power supply 100 and the CVR 200 are designed so that when they are coupled to each other as shown in FIGS. 14–16, they have approximately the same center of gravity as the prior art CVR 50 (FIGS. 4–6). Furthermore, as mentioned above, the power supply 100 is "plug compatible" with the existing tray so that all of the related aircraft electronics behaves substantially the same was as if an existing CVR were in the tray.

It is said that the electronics behave "substantially" the same because, as described in more detail below, a certain modification has been made so that the CVR test switch in the cockpit of the aircraft can be used to test both the CVR 200 and the power supply 100 and to receive fault indications therefrom.

According to present specifications, well known to those skilled in the art, "pin 12" on the existing CVR is coupled to a test switch in the cockpit. When this pin is grounded by the test switch, built in test equipment on the CVR conducts a self test. A passing test result is signaled by the CVR by applying a 1 ma current across "pins 15 and 16". In addition, according to present specifications, any other built in test result may be reported by grounding "pin 23".

According to a preferred embodiment of the present invention, when the existing test switch for the CVR is activated in the cockpit, two self-tests are initiated one in the modular power supply 100 and another in the CVR 200 module. The result of the CVR test is reported via "pins 15 and 16" and "pin 23" is used t o report the test result for the power supply.

Referring now to FIGS. 3, 9, 10, 13 and 17, the present specifications for CVR and CVR tray include the specification that "pins 7 and 8" in the tray socket 32 are "jumpered together". This jumper signals to the CVR that it is in the CVR tray and prevents the CVR from switching from the record mode to the play mode.

When the jumper is removed, or the CVR is removed from the tray, the CVR switches from the record mode to the play mode. The present invention preserves the functionality of this jumper with regard to the CVR record/play mode and make additional use of the jumper as illustrated in FIG. 17.

Figure 17:
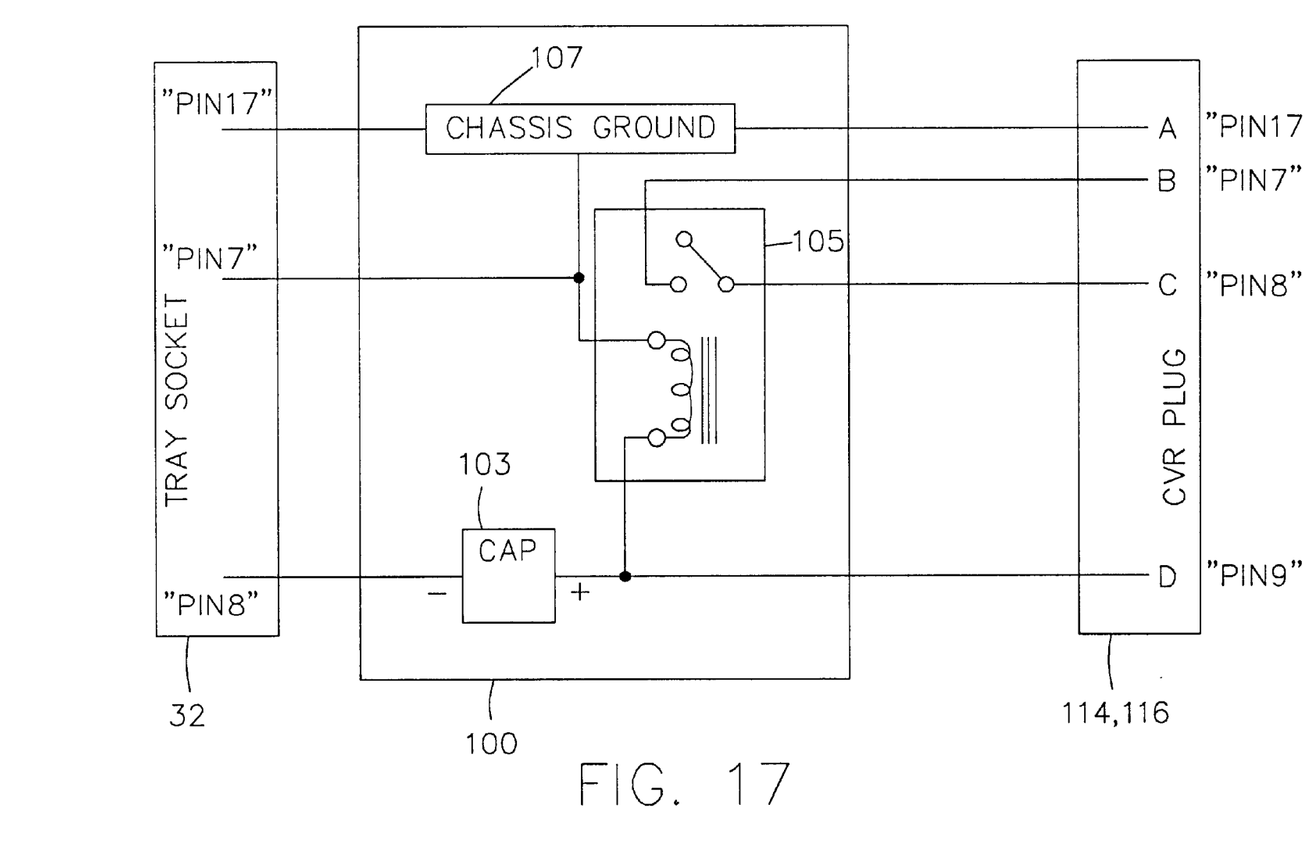
FIG. 17 is a simplified schematic diagram of a circuit to electrically decouple the independent power supply from the CVR when the independent power supply is removed from the existing CVR tray.

As shown in FIG. 17, a preferred embodiment of an illustrative power supply 100 includes, among other things, a capacitor 103 and a relay 105. (It will be appreciated that the relay 105, though illustrated as an electromagnetic relay, may be an electronic switch.) The positive node of the capacitor 103 is coupled to one node of the relay coil and is passed through the socket 114, 116 (illustrated as D "pin 9") to the CVR.

The negative node of the capacitor 103 passes through the "pin 7 and 8" shunt to the chassis ground 107 where it is passed via pin A ("pin 17") of plug 114, 116 to the CVR. Pins B and C of the plug 114, 116 are connected to the switching terminals of the relay 105. These pins (B and C) act as the record mode switch formerly performed by "pins 7 and 8".

Those skilled in the art will appreciate that when the power supply 100 is in the tray coupled to the socket 32, the relay 105 will be activated causing a jumper between pins B and C for the CVR. When the CVR is removed from the power supply, it will switch to play mode. Moreover, if the CVR and power supply are removed as a unit from the tray, the jumpering of pins B and C will also cease because the relay 105 will no longer be powered.

Furthermore, the "pin 7 and 8" jumper now also provides an additional function. It uncouples the power supply capacitor 103 from the chassis ground 107 when the power supply is removed from the tray. This safeguards the power supply 100 from potentially damaging or dangerous short circuit accidents.

There has been described and illustrated a retro-fittable cockpit voice recorder with removable/replaceable independent power supply. While a particular embodiment of the invention has been described, it is not intended that the invention be limited thereto, as it is intended that the invention be as broad in scope as the art will allow and that the specification be read likewise.

For example, although modular power supply and recorder units have been used to illustrate the preferred embodiment of the invention (to facilitate, for example, testing, repair and maintenance of one unit without having to open and re-seal/re-test both units, etc.), an integrated power supply/recorder that fits substantially into the footprint of a conventional cockpit voice recorder comes within the teachings of the invention.

As a further example, although the above described power supply is preferably generally "L-shaped" and has a footprint which is substantially the same as an existing CVR; those skilled in the art will readily appreciate that so long as the independent power and cockpit voice recorder modules contemplated by the invention have, in combination, a footprint which is substantially the same as an existing CVR (fitting into an existing tray), the particular shape of the modules could be varied.

Furthermore, although the invention is described with reference to a preferred embodiment where a modular power supply is installed in an existing rack first (followed by a modular piece of avionics equipment being coupled thereto); those skilled in the art will readily appreciate that a reverse installation would come within the scope and teachings of the invention, i.e., where the avionics unit is modified to accept a plug in power supply and the avionics equipment is installed in an existing tray first, followed by the power supply.

It will therefore be appreciated by those skilled in the art that yet other modifications could be made to the disclosed invention without deviating from its spirit and scope as claimed hereinafter.

What is claimed is:
1. A method for providing a back up power supply for avionics equipment, comprising the steps of:
   (a) utilizing a back up power supply that includes a self contained power source;
   (b) combining said back up power supply with the avionics equipment such that the combination of equipment fits into a conventional equipment tray; and
   (c) retrofitting the combination of said power supply and said avionics equipment into a conventional equipment tray without rewiring the aircraft.
2. A method as set forth in claim 1 further comprising the step of fabricating said back up power supply and said avionics equipment as modular units.
3. A method as set forth in claim 1 further comprising the step of fabricating said power supply and said avionics equipment as a single integrated unit.
4. A method as set forth in claim 1 further comprising the step of associating with said power supply a fault reporting capability that uses existing aircraft wiring to report faults to the pilot.
5. A method as set forth in claim 1 further comprising the step of associating with said power supply a push to test feature that uses existing aircraft wiring to initiate said test.
6. A method as set forth in claim 1 wherein said avionics equipment is a cockpit voice recorder.
7. A method as set forth in claim 1 wherein said power supply includes a capacitor.
8. A method as set forth in claim 1 wherein said power supply includes a battery.
9. A method as set forth in claim 1 further comprising the steps of:
   (a) coupling said power supply directly to the coupling in a conventional tray that is connected to aircraft wiring; and
   (b) coupling said avionics equipment to said power supply.
10. A method as set forth in claim 1 further comprising the steps of:
   (a) coupling said avionics equipment directly to the coupling in a conventional equipment tray that is connected to aircraft wiring; and

(b) coupling said power supply to said avionics equipment.

11. A method as set forth in claim 1 further comprising the step of terminating power from said back up power supply to said avionics equipment after a predetermined period of time.

12. A method as set forth in claim 1 further comprising the step of automatically decoupling the negative pole of said power supply whenever said power supply is removed from an equipment tray.

13. A method for providing a back up power supply for avionics equipment, comprising the steps of:
   (a) fabricating a back up power supply module, including a self contained power source, that is plug compatible with a conventional tray avionics equipment connector; and
   (b) fabricating said power supply module to be plug compatible with said avionics equipment, the combination of said power supply and said avionics equipment being able to fit substantially within said tray.

14. An independent power supply for an avionics instrument, comprising:
   (a) a chassis adapted to electrically and mechanically couple to an existing avionics equipment tray;
   (b) a first mating electrical connection mounted on said chassis for mating with the electrical connection the existing avionics equipment tray;
   (b) a second mating electrical connection mounted on said chassis for mating with the avionics instrument; and
   (c) mounting means on said chassis for mounting the avionics instrument on said chassis.

15. An independent power supply for a cockpit voice recorder, comprising:
   (a) a chassis, said chassis being able to fit into and couple with the same tray as an existing cockpit voice recorder;
   (b) a first mating electrical connection mounted on said chassis for mating with the electrical connection of a cockpit voice recorder tray;
   (c) a second mating electrical connection mounted on said chassis for mating with a cockpit voice recorder; and
   (d) mounting means on said chassis for mounting the cockpit voice recorder to said chassis.

16. An independent power supply according to claim 15 wherein said chassis has substantially the same footprint as a conventional cockpit voice recorder.

17. An independent power supply according to claim 16 further comprising automatic jumpering means for jumpering two pins in said second mating electrical connection.

18. An independent power supply according to claim 16 wherein when said independent power supply is mounted in a cockpit voice recorder tray said two pins are jumpered and when said independent power supply is removed from the cockpit voice recorder tray said two pins are un-jumpered.

19. An independent power supply according to claim 17 further comprising means for automatically decoupling the negative pole of said power supply from said chassis when said independent power supply is removed from a cockpit voice recorder tray.

20. An independent power supply according to claim 19 wherein said means for automatically decoupling includes said negative pole of said power supply being coupled to a first pin in said first mating electrical connection and said chassis being coupled to a second pin in said first mating electrical connection.

21. An independent power supply according to claim 20 wherein said automatic jumpering means includes relay means electrically coupled to said chassis and to a positive pole of said power supply.

22. An independent power supply according to claim 15 wherein said chassis has a generally L-shaped configuration with an upstanding back and a lower bed for receiving cockpit voice recorder.

23. An independent power supply according to claim 22 wherein said chassis has a pair of guide pin receiving holes in its upstanding back for receiving a pair of tapered guide pins of the cockpit voice recorder tray.

24. An independent power supply according to claim 23 wherein said chassis has a pair of L-shaped brackets located to be engaged by a pair of locking nuts on the cockpit voice recorder tray.

25. An independent power supply according to claim 24 wherein said chassis has a pair of ratchet nuts for engaging a pair of L-shaped brackets on the cockpit voice recorder.

26. A cockpit voice recorder and independent power supply combination retrofittable to an existing cockpit voice recorder tray in place of the existing cockpit voice recorder, comprising:
   (a) an independent power supply having an exterior configuration which mates with the existing cockpit voice recorder tray in substantially the same manner as the existing cockpit voice recorder; and
   (b) a solid state cockpit voice recorder having means for electrically and mechanically coupling to said independent power supply.

27. A cockpit voice recorder and independent power supply combination according to claim 26 wherein said independent power supply includes a first mating electrical connection for mating with the electrical connection of the existing cockpit voice recorder tray, and a second mating electrical connection for mating with said solid state cockpit voice recorder.

28. A cockpit voice recorder and independent power supply combination according to claim 27 wherein said independent power supply includes automatic jumpering means for jumpering two pins in said second mating electrical connection.

29. A cockpit voice recorder and independent power supply combination according to claim 27 wherein when said independent power supply is mounted in the existing cockpit voice recorder tray said two pins are jumpered and when said independent power supply-is removed from the existing cockpit voice recorder tray, said two pins are un-jumpered.

30. A cockpit voice recorder and independent power supply combination according to claim 28 wherein said independent power supply includes means for automatically decoupling the negative pole of said power supply from said chassis when said independent power supply is removed from a cockpit voice recorder tray.

31. A cockpit voice recorder and independent power supply combination according to claim 30 wherein said means for automatically decoupling includes said negative pole of said power supply being coupled to a first pin in said first mating electrical connection and said chassis being coupled to a second pin in said first mating electrical connection.

32. A cockpit voice recorder and independent power supply combination according to claim 31 wherein said automatic jumpering means includes relay means electrically coupled to said chassis and to a positive pole of said power supply.

33. A cockpit voice recorder and independent power supply combination according to claim 26, wherein said independent power supply has a generally L-shaped chassis with an upstanding back and a lower bed for receiving said solid state cockpit voice recorder.

34. A cockpit voice recorder and independent power supply combination according to claim 33 wherein said chassis has a pair of guide pin receiving holes in its upstanding back for receiving a pair of tapered guide pins of the existing cockpit voice recorder tray.

35. A cockpit voice recorder and independent power supply combination according to claim 34 wherein said chassis has a pair of L-shaped brackets located to be engaged by a pair of locking nuts oh the existing cockpit voice recorder tray.

36. A cockpit voice recorder and independent power supply combination according to claim 35 wherein said chassis has a pair of ratchet nuts and said solid state cockpit voice recorder has a pair of L-shaped brackets which are engageable by said ratchet nuts.

37. A cockpit voice recorder and independent power supply combination according to claim 26 wherein said solid state cockpit voice recorder has a pinger bracket.

38. A cockpit voice recorder and independent power supply, comprising:
   (a) a chassis adapted to electrically and mechanically couple to an existing cockpit voice recorder tray;
   (b) a cockpit voice recorder mounted on said chassis; means for storing a charge mounted on said chassis; and
   (c) means for automatically electrically coupling said means for storing a charge to said cockpit voice recorder upon an aircraft power failure.

39. A cockpit voice recorder and independent power supply according to claim 38 wherein said means for storing a charge is a capacitor.

40. A cockpit voice recorder and independent power supply according to claim 38 wherein said means for storing a charge is a battery.

* * * * *